United States Patent [19]

Eschler et al.

[11] 4,051,582
[45] Oct. 4, 1977

[54] TECHNIQUES FOR PRODUCING AN ACOUSTO-OPTICAL COMPONENT OR A WIDE-BAND ULTRASONIC COMPONENT

[75] Inventors: Hans Eschler; Rudolf Oberbacher, both of Munich, Germany

[73] Assignee: Siemens Aktiengesellschaft, Berlin & Munich, Germany

[21] Appl. No.: 641,382

[22] Filed: Dec. 16, 1975

[30] Foreign Application Priority Data

Dec. 19, 1974 Germany .................. 2460207

[51] Int. Cl.$^2$ .................................. H01L 41/22
[52] U.S. Cl. .................... 29/25.35; 29/594; 228/121
[58] Field of Search ........... 29/25.35, 594; 228/121, 228/193; 310/8.7, 9.7, 9.4; 333/30 R, 72

[56] References Cited

U.S. PATENT DOCUMENTS

| | | | |
|---|---|---|---|
| 3,469,120 | 9/1969 | Nagao et al. | 333/30 R |
| 3,590,467 | 7/1971 | Chase et al. | 228/121 |
| 3,798,746 | 3/1974 | Alphonse | 29/594 |
| 3,897,628 | 8/1975 | Hanak et al. | 29/25.35 |
| 3,921,885 | 11/1975 | Knox | 228/116 |

*Primary Examiner*—Carl E. Hall

*Attorney, Agent, or Firm*—Hill, Gross, Simpson, Van Santen, Steadman, Chiara & Simpson

[57] ABSTRACT

An acousto-optical component or other high frequency and wide-band ultrasonic component comprises a piezoelectric transducer and a crystalline or glass sound medium which are bonded together by a multi-layer metal molecular adhesion bond. During fabrication, the surfaces of the piezoelectric body and the sound medium which are to be connected are first polished to a degree of smoothness which is well below that of a Newton ring. These surfaces are then completely cleansed and a first metal layer having a thickness of 0.5-2 nm is vapor deposited onto each the cleansed surfaces. Next, a second metal layer having a thickness of 5-20 nm is vapor deposited onto each of the first layers. The transducer is then applied, by molecular adhesion, to the sound medium. To form a strong and reliable bond, only moderate pressures of about 250 to 1500 psi are necessary. A metal layer having a thickness of 0.3-0.6 μm is vapor deposited over an extending portion of the multi-layer bond as a terminal for connection to a high frequency supply. Subsequently, the transducer is ground to a desired thickness in order to obtain a desired resonant frequency and a second electrode is applied to another surface of the piezoelectric body for connection to the high frequency supply.

18 Claims, 1 Drawing Figure

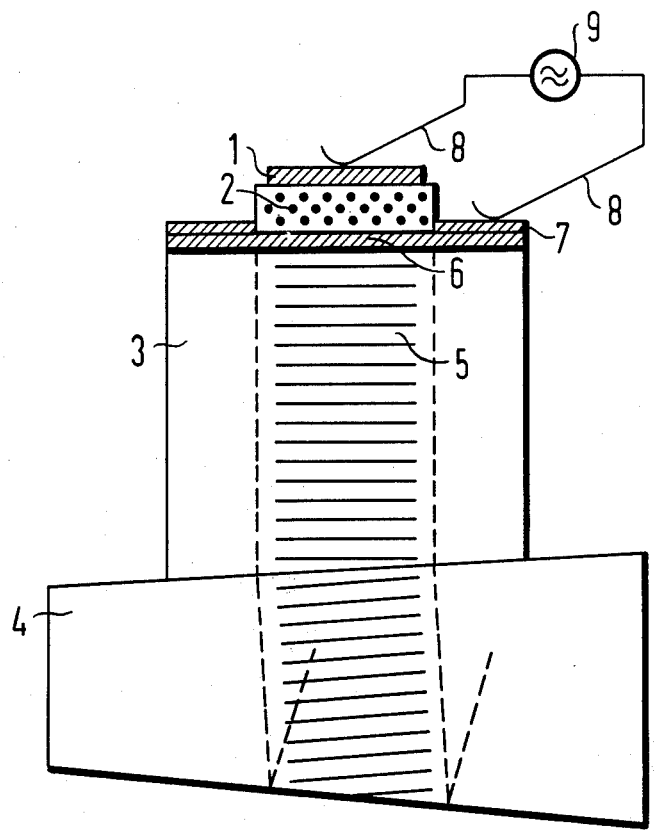

even at very high frequencies does not actually exist.

TECHNIQUES FOR PRODUCING AN ACOUSTO-OPTICAL COMPONENT OR A WIDE-BAND ULTRASONIC COMPONENT

BACKGROUND OF THE INVENTION

1. Field of the Invention

The present invention relates to techniques for producing an acousto-optical component or another high-frequency and wide-band ultrasonic component which comprises a piezoelectric transducer connected to a crystal or glass sound medium.

2. Description of the Prior Art

New uses and applications are constantly being found for acousto-optical components in the ultrasonic technique. Because of their simplicity, acousto-optical light deflectors can be used for many applications, such as optical communications transmission systems, optical stores, display devices and optical printers, in an advantageous manner.

In addition, ultrasonic cyclic stores and delay lines in the frequency range to well about 100 MHz are becoming required to an increasing extent.

Acousto-optical light deflectors can be used, for example, to deflect an optical beam within microseconds, selective into one of $10^3 - 10^5$ discrete deflection directions, whereby continuous sound waves deflect a light beam, for example a laser beam, and the switchover time between two arbitrary beam directions is governed by the transit time of the sound wave through the light beam cross section.

A typical acousto-optical light deflector comprises a deflecting medium, such as iodic acid, lead molybdate and paratellurite in crystal form, for example, and of glasses having a high index of refraction, such as heavy flints, and a piezoelectric transducer which is connected to the deflecting medium. Here the technical problem arises of achieving a reliable and lasting connection between the piezoelectric transducer and the deflecting medium,

SUMMARY OF THE INVENTION

The object of the present invention is to provide an improved ultrasonic component which has an optimal input coupling of the sound power into the sound medium, in particular at frequencies about 100 MHz, and which requires only a minimum expense for the apparatus.

In order to realize the above object, the present invention proposes that both the surface of the transducer which is to be connected to the sound medium, and the surface of the sound medium which is to be connected to the transducer, are polished to a degree of smoothness well below that of a Newton ring, and that these polished surfaces be completely cleansed in a suitable manner. Following cleansing, a first metal layer having a thickness of 0.5-2 nm is vapor deposited onto each of the connection surfaces and a second metal layer having a thickness of 5-20 nm is vapor deposited onto the first metal layers. Then, the transducer is applied, by molecular adhesion, to the deflecting medium. To form a strong and reliable bond, only moderate pressures of about 250 to 1500 psi are necessary. A metal layer having a thickness of 0.3-0.6 μm is vapor deposited onto the layer structure as a first input terminal and the transducer is ground to the desired thickness. Subsequently, a second input terminal is applied to the transducer.

Preferably, a titanium, chrome or platinum layer is vapor deposited as the first layer on the transducer and on the sound medium, whereas a gold layer is vapor deposited as a second layer on each of the first layers.

Advantageously, a gold layer is vapor deposited on a portion of the multi-layer structure as the first-mentioned input terminal.

The process, according to the invention, provides the particular advantage that connection layers which are subject to loss are virtually avoided. The thin electrode layer arranged between the transducer and the deflecting medium does not noticeably impede the sound transmission between the piezoelectric transducer and the deflecting medium, even at very high frequencies. Further advantage consists in the comparatively low expense for apparatus for the production of the connection outside the vacuum and the low mechanical strain on the surfaces which are to be connected.

Because of the possibility of multiple connection attempts and the continuous visual control, very high yields of permanent and reliable connections can be achieved. Due to the loss-free input coupling of the sound, thermal effects remain limited to the values resulting from the losses inside the transducer.

BRIEF DESCRIPTION OF THE DRAWINGS

Other objects, features and advantages of the invention, its organization, construction and operation will be best understood from the following detailed description taken in conjunction with the accompanying drawing, on which the single FIGURE is a schematic representation of a light deflector constructed in accordance with the invention.

DESCRIPTION OF THE PREFERRED EMBODIMENTS

Referring to the drawing, a light deflector is illustrated as comprising an upper electrode 1, a piezoelectric transducer 2, and a deflecting medium 3, which, for example, can consist of crystals of iodic acid, lead molybdate or glasses. A sound absorber 4 is composed of glass or aluminum, for example.

A high frequency generator 9 is connected, via contacts 8, both to the top electrode 1 and also to a terminating and protective electrode 7, and produces an ultrasonic wave 5 in the sound medium 3. The sound medium 3 and the piezoelectric transducer 2 are connected to one another via a thin base electrode 6 which has a thickness of approximately 5-20 nm.

Molecular adhesion has been used for a considerable time by opticians for connecting glass samples. This art requires very clean optical surfaces which must be polished to be extremely smooth. The connections, which can only be released applying a strong force, are due to adhesion forces which come into effect when the distance between two optical surfaces is clearly less than 100 nm, although the actual distances between the surfaces normally vary between 0 and 20 nm.

It has been discovered that the molecular adhesion technique can also be used when thin metal layers, for example gold layers, which are no more than 20 nm thick, are vapor deposited onto one, or both, of the two optical surfaces which are to be connected. Therefore, it may be assumed that molecular adhesion can be used as an independent art for connecting the transducer and the sound medium in ultrasonic delay lines or acousto-optical components.

The base electrode 6 is to be as thin as possible, on the one hand, to facilitate adhesion, and, on the other hand, its thickness must not be allowed to fall below a specific limit value because of the current heat losses (thermal effects).

In order to achieve the best possible all-round grounding of the base electrodes 6, when the connection has been established, a relatively thick electrode layer 7 is vapor deposited over the exposed portion of the base electrode 6.

The production of the acousto-optical light deflector in accordance with the invention takes place as follows:

The surfaces of the piezoelectric transducer 1 and of the deflecting medium 3 which are to be connected must first be polished to a smoothness below a Newton ring ('white pass'). When the surfaces have been thoroughly cleansed, a first metal layer, for example a titanium layer, having a thickness of 0.5-2 nm, and preferably 1 nm, is vapor deposited onto each surface (precleansing), and then a second metal layer, for example a gold layer, having a thickness of 5-20 nm, and preferably 5-10 nm, is vapor deposited onto each of the first metal layers. Chrome and platinum layers or other suitable metal layers can also be used for the pre-cleansing.

The thickness of the layers can be checked, e.g., by measuring the electric surface resistance. The components removed from the vapor deposition unit are prepared for molecular adhesion by means of a further thorough cleansing process. The piezoelectric transducer 2 is now caused to adhere to the deflecting medium 3. This procedure often necessitates several attempts after each of which the surfaces must be cleansed, since even minute particles prevent the connection from taking place. The advantage of the molecular adhesion technique consists in that the quality of the connection can be constantly checked optically. In this manner, it is possible to achieve a very high yield of excellent connections. The two thin gold layers on the surfaces of the transducer 2 and the deflecting medium 3 which are to be connected will fuse to form virtually one layer when a molecular adhesion connection is correctly carried out. It is in this manner that the best possible sound transmission between the transducer and the sound medium is attained.

When the two surfaces have been joined in the manner set forth above, an approximately 0.3-0.6 $\mu$m thick gold layer 7 is vapor deposited over the transducer and intermediate layer, or base layer 6, in order to ensure the optimum supply of the high frequency voltage via one of the contact springs 8 to the very thin base electrode 6.

Finally, the piezoelectric transducer is ground to the requisite final thickness of 20 $\mu$m to 50 $\mu$m, whereupon the top electrode 1 is vapor deposited onto the transducer.

A process carried out in accordance with the invention results in a high yield and a high degree of reliability in the production of acousto-opticl light deflectors, together with optimum sound transmission, low stress to the materials and a small outlay in an apparatus.

Transducers having fundamental resonant frequencies of up to 200 MHz can be produced by grinding the piezoelectric plates to a thickness of about 20 $\mu$m. The sputter processing technique, which is known per se, can be used to extend the frequency range, attainable with monocrystalline transducers, to a few GHz.

Although we have described our invention by reference to particular examples thereof, many changes and modifications of the invention may become apparent to those skilled in the art without departing from the spirit and scope of the invention. We therefore intend to include within the patent warrented hereon all such changes and modifications as may reasonably and properly be included within the scope of our contribution to the art.

We claim:

1. A process for producing an ultrasonic component which comprises a piezoelectric transducer and a sound medium, comprising the steps of:
    smoothing a surface of the sound medium and a surface of the piezoelectric material to a degree of smoothness which is well below that of a Newton ring;
    cleaning the smoothed surfaces;
    applying a first metal layer having a thickness in the range of 0.5-2 nm to each of the cleansed surfaces;
    applying a second metal layer having a thickness in the range of 5-20 nm to each of the first metal layers;
    bonding the second metal layers together by molecular adhesion with a portion of the metal layers of the sound medium remaining exposed;
    applying a third metal layer having a thickness in the range of 0.3-0.6 $\mu$m to the exposed portion of the metal layers of the sound medium and to the piezoelectric material; and
    adjusting the resonant frequency of the transducer to a desired frequency.

2. The process of claim 1, wherein the step of smoothing is further defined as polishing.

3. The process of claim 1, wherein the steps of applying the first, second and third metal layers are further defined as vapor depositing such metal layers.

4. The process of claim 1, wherein the step of adjusting the resonant frequency of the transducer is further defined by the step of:
    reducing the thickness of the piezoelectric transducer to a thickness which provides the desired resonant frequency.

5. The process of claim 4, wherein the step of reducing the thickness of the piezoelectric transducer is further defined as grinding the transducer to a desired thickness.

6. The process of claim 5, wherein the step of grinding is further defined as grinding the piezoelectric material to a thickness in the range of 20-50 $\mu$m.

7. The process of claim 1, wherein the step of applying the first metal layer is further defined as vapor depositing titanium on each smoothed surface.

8. The process of claim 1, wherein the step of applying the first metal layers is further defined as vapor depositing chrome on each smoothed surface.

9. The process of claim 1, wherein the step of applying the first metal layers is further defined as vapor depositing platinum on each smoothed surface.

10. The process of claim 1, wherein the step of applying the second metal layer is further defined as vapor depositing gold on each first metal layer.

11. The process of claim 1, wherein the step of applying a third layer is further defined as vapor depositing gold on the exposed portion of the metal layers.

12. The process of claim 1, wherein the step of applying the first metal layers is further defined as applying each of the first metal layers at a thickness of 1 nm.

13. The process of claim 1, wherein the step of applying the second metal layers is further defined as applying each of the second metal layers at a thickness in the range of 5-20 nm.

14. The process of claim 1, and further comprising the step of:
applying a metal electrode to another surface of the piezoelectric material.

15. A process for the production of an ultrasonic component which includes a peizoelectric transducer and a sound medium, comprising the steps of:
polishing a surface of the piezoelectric material to a degree of smoothness which is less than that of a Newton ring;
polishing a surface of the ultrasonic medium to a degree of smoothness which is less than that of a Newton ring;
cleaning each of the polished surfaces;
vapor depositing a first metal layer on each of the cleansed surfaces of a thickness in the range of 0.5-2 nm and of a material selected from the group consisting of titanium, chrome, and platinum;
vapor depositing a layer of gold of a thickness in the range of 5-20 nm over each of the first metal layers;
bonding the gold layers together by molecular adhesion with the piezoelectric material and the sound medium positioned to leave a portion of the metal layers carried on the sound medium exposed;
vapor depositing a gold layer of a thickness in the range of 0.3-06 μm on the exposed portion of the metal layers carried on the sound medium;
grinding the thickness of the piezoelectric material to obtain a desired resonant frequency; and
vapor depositing a metal layer on another surface of the piezoelectric material.

16. The process of claim 15, wherein the step of vapor depositing the first metal layers is further defined as depositing a thickness of 1 nm.

17. The process of claim 15, wherein the step of vapor depositing the second metal layers is further defined as depositing a thickness of 5-20 nm.

18. The process of claim 15, wherein the step of grinding is further defined as grinding the piezoelectric material to a thickness of 20-50 μm.

* * * * *